US012686783B2

(12) United States Patent
Hong et al.

(10) Patent No.: US 12,686,783 B2
(45) Date of Patent: Jul. 21, 2026

(54) INK COMPOSITION FOR OLED PACKAGING AND AN APPLICATION THEREOF

(71) Applicant: HANGZHOU FIRST APPLIED MATERIAL CO., LTD., Hangzhou (CN)

(72) Inventors: Haibing Hong, Hangzhou (CN); Xin Shen, Hangzhou (CN); Chufeng Yang, Hangzhou (CN); Shihao Wang, Hangzhou (CN)

(73) Assignee: HANGZHOU FIRST APPLIED MATERIAL CO., LTD., Hangzhou (CN)

( * ) Notice: Subject to any disclaimer, the term of this patent is extended or adjusted under 35 U.S.C. 154(b) by 379 days.

(21) Appl. No.: 18/689,060

(22) PCT Filed: Jul. 1, 2022

(86) PCT No.: PCT/CN2022/103410
§ 371 (c)(1),
(2) Date: Mar. 4, 2024

(87) PCT Pub. No.: WO2023/065723
PCT Pub. Date: Apr. 27, 2023

(65) Prior Publication Data

US 2024/0368419 A1 Nov. 7, 2024

(30) Foreign Application Priority Data

Oct. 19, 2021 (CN) ......................... 202111213306.1

(51) Int. Cl.
*H10K 50/84* (2023.01)
*C09D 11/101* (2014.01)
(Continued)

(52) U.S. Cl.
CPC ............ *C09D 11/38* (2013.01); *C09D 11/101* (2013.01); *H10K 50/84* (2023.02); *H10K 85/40* (2023.02); *H10K 2102/351* (2023.02)

(58) Field of Classification Search
CPC ............................. H10K 50/84; H10K 50/844
See application file for complete search history.

(56) References Cited

U.S. PATENT DOCUMENTS

2004/0163570 A1 8/2004 Vanmaele et al.
2017/0227846 A1* 8/2017 Zheng ..................... G03F 7/038
(Continued)

FOREIGN PATENT DOCUMENTS

CN 103391979 A 11/2013
CN 103996799 A 8/2014
(Continued)

OTHER PUBLICATIONS

The first Office Action of the corresponding KR patent application No. 10-2024-7016545, mail date Dec. 4, 2025.
(Continued)

*Primary Examiner* — Benjamin P Sandvik
(74) *Attorney, Agent, or Firm* — The Sun IP Law

(57) ABSTRACT

Provided are a Polyhedral Oligomeric Silsesquioxane (POSS) structure-containing ink composition and an application thereof. The ink composition includes, by weight percentage, 20-40% of a POSS structure-containing monomer, 50-70% of a photocuring monomer, and 1-10% of a photoinitiator; and the POSS structure-containing monomer includes a repeating unit as shown in a general formula $(R—SiO_{1.5})_n$, where at least one R group is selected from a structure having acryloyloxy or methacryloyloxy. By introducing the POSS structure into the ink composition for Organic Light-Emitting Diode (OLED) packaging, the ink composition has a better packaging effect, and an organic
(Continued)

packaging layer prepared by the ink has a good and extremely-low Water Vapor Transmission Rate (WVTR) and Oxygen Transmission Rate (OTR), such that the service life of an OLED device can be effectively prolonged. In addition, the ink composition can effectively reduce the preparation cost and process difficulty of an OLED packaging thin film.

19 Claims, 2 Drawing Sheets

(51) Int. Cl.

| | |
|---|---|
| ***C09D 11/38*** | (2014.01) |
| ***H10K 85/40*** | (2023.01) |
| ***H10K 102/00*** | (2023.01) |

(56) References Cited

U.S. PATENT DOCUMENTS

| | | | |
|---|---|---|---|
| 2018/0094161 | A1 | 4/2018 | Lee et al. |
| 2018/0251645 | A1 | 9/2018 | Magdassi |

FOREIGN PATENT DOCUMENTS

| | | | |
|---|---|---|---|
| CN | 109251584 | A | 1/2019 |
| CN | 111154327 | A | 5/2020 |
| CN | 111785845 | A | 10/2020 |
| CN | 114015277 | A | 2/2022 |
| DE | 60-2004004179 | T2 | 11/2007 |
| EP | 1452569 | A1 | 9/2004 |
| JP | 2004-339480 | A | 12/2004 |
| KR | 20170039882 | A | 4/2017 |
| KR | 1020210059188 | A | 5/2021 |
| TW | 201538596 | A | 10/2015 |
| TW | 201723104 | A | 7/2017 |
| WO | 2017052186 | A1 | 3/2017 |

OTHER PUBLICATIONS

The first office action of counterpart EP application No. 22882345 issued on Oct. 29, 2024.

* cited by examiner

INK COMPOSITION FOR OLED PACKAGING AND AN APPLICATION THEREOF

CROSS-REFERENCE TO RELATED APPLICATIONS

The present application is a National Stage of International Patent Application No: PCT/CN2022/103410 filed on Jul. 1, 2022, which application claims the benefit of priority to the Chinese patent application No. 202111213306.1 filed on Oct. 19, 2021, which is herein incorporated by reference in their entirety.

TECHNICAL FIELD

The present disclosure relates to the field of thin film packaging of semiconductor display devices, and in particular, to a Polyhedral Oligomeric Silsesquioxane (POSS) structure-containing ink composition and an application thereof.

BACKGROUND

Organic Light-Emitting Diodes (Organic Light-Emitting Diodes, OLED) has the characteristics of being all in solid state, active in light emitting, high in brightness, high in contrast, ultrathin, ultralight, low in cost, low in power consumption, limitation-free in viewing angle, and wide in working temperature range, and may be manufactured on a flexible, lightweight, and durable plastic substrate, so as to realize true flexible display, such that the OLED is a technology that can best meet the requirements of people for future displays.

Compared with Liquid Crystal Display (LCD), an Organic Light-Emitting Diode (OLED) has the advantages of being low in driving voltage, high in light-emitting brightness and light-emitting efficiency, wide in light-emitting viewing angle, fast in response speed, and ultrathin, may be manufactured on a flexible panel, and is praised as a third generation flat panel display technology.

However, at the present stage, the biggest problem of the OLED is that the service life is shorter than that of the LCD, and the service life of the OLED is only about 5000 hours, which is significantly inferior to the service life of the LCD. The service life of an OLED device is the key problem that currently plagues many OLED experts and scholars, and is a bottleneck restricting the development of an OLED industry. There are still difficulties in solving the problem completely at the technical level, and it also takes some time to shorten the gap between the service life of the OLED and the LCD. Therefore, current OLED products are only suitable for manufacturing some small devices, such as a vehicle Digital Video Disk (DVD) player, a Personal Digital Assistant, a digital camera, and a mobile phone screen. We believe that, with the rapid development of the OLED technology, the problem will eventually be solved. In the 21st century, an OLED display has the potential to fully replace an LCD display and other types of displays, becoming a mainstream display for TVs, computers, telephones, billboards, and a variety of instruments and meters.

There are many factors affecting the service life of the OLED device, for example, physical factors such as device structures and circuit driving modes, and chemical factors such as oxidation of metal cathodes and crystallization of organic materials. Although the failure mechanism of the OLED is not fully understood, there are many research results showing that the presence of water vapor and oxygen inside the OLED device is the main factor affecting the service life of the OLED.

According to the research of Kodak Company on methods for prolonging the service life of the OLED, the expected gains of the various methods are shown in Table 1 below:

TABLE 1

Expected gain effects of various method for prolonging the service life of an OLED

| Method | Expected gain (multiple) |
|---|---|
| Packaging | ~20 |
| Dry and anaerobic production environments | 1.1-1.5 |
| Selection of more stable light-emitting materials | 1.1-10 |
| Photophysical and photochemical degradation mechanisms | 3 |
| Electrode and heterogeneous interface chemistry | <1.5 |
| Feedback control, compensation control | 1.5-5 |

From the above table, it may be seen that, for solving the service life of a device, improving a packaging process is the most direct and effective method.

For the OLED device, if the normal service life reaches over 10000 hours, the Water Vapor Transmission Rate (WVTR) of the device needs to be less than $10^{-6}$ g/m$^2$/day, and an Oxygen Transmission Rate (OTR) needs to be less than $10^{-5}$ g/m$^2$/day, which is a great challenge for a hermetic structure of a display device, such that an appropriate OLED packaging technology needs to be studied.

The objective of OLED packaging is to separate a light-emitting device from an environment, so as to avoid invasion of adverse substances such as water and oxygen, prevent external force damage, and stabilize parameters of the device, thereby prolonging the service life of the OLED. The packaging of the OLED mainly includes several manners of cover plate packaging, filler packaging, laser packaging, and thin film packaging.

Traditional cover plate packaging is to bond, by using an epoxy resin, a prepared substrate and a cover plate in a glove box filled with inert gas, so as to form a closed space to separate a device from an external environment, and components such as water and oxygen in air can only permeate into the device by means of the epoxy resin, such that the water and oxygen in air of each functional layer of the OLED is relatively effectively prevented from contacting. A material for packaging the cover plate generally uses glass or metal. However, a metal cover plate is limited to a certain extent in the application of device packaging due to opacity; and although the packaging of a glass cover plate has no transparency problem, the glass cover plate is poor in toughness and easy to break.

The three packaging methods of laser packaging, filler packaging and thin film packaging do not need to use desiccants, and may be used in a top-emitting OLED device. The laser packaging has the advantage of being good in sealing effect, such that water vapor can be well blocked from entering. The laser packaging has the disadvantage of being complex in formulation of a glass powder material. The laser packaging is relatively difficult in process control, and shows black silk after laser curing, severely affecting aesthetics. During filler packaging, due to the viscous nature of a liquid filling adhesive, bubbles that are difficult to eliminate are often generated when being poured in a sealing strip, and left in a packaging layer, and the bubbles contain water and oxygen, thus affecting the service life and performance of the OLED device.

The thin film packaging is to grow a single or a plurality of layers of thin films on the prepared substrate of the OLED device, so as to achieve a blocking effect of water vapor. Research on an OLED thin film usually uses method of organic/inorganic composite thin films. An inorganic thin film is able to effectively block the water vapor and oxygen, but is poor in film-forming property and interface matching performance, and easy to form defects; and due to a free volume and large average degree of freedom of chain segments of an organic thin film, it is determined that the organic thin film is good in flexibility, good in film formation, and high in flatness. Therefore, the effect of the organic thin film may mask the defects of the inorganic thin film. By using the high barrier property of the inorganic film on the water vapor and the oxygen and the good surface morphology of the organic film, a relatively-satisfactory result can be obtained by means of packaging using a method of alternately forming films with the organic film and the inorganic film.

The thin film packaging is represented by triple-stacked layer structure (PECVD-Flatness-PECVD), and the excellent performance of the thin film packaging has become a mainstream mode of flexible OLED packaging. In a triple-stacked layer, a first inorganic layer ($SiN_x$) is a smooth substrate, an organic polymer buffer layer is obtained on the substrate by means of ink jet printing and then curing, and a third inorganic layer ($SiN_x$) is the last inorganic layer.

The organic polymer buffer layer (an organic Ultraviolet (UV) curing resin) is known as a conventional and effective packaging material due to good curing characteristics, stability, bonding strength, light transmittance, and high purity. The commonly-used organic polymer buffer layer includes acrylic resin, methacrylic acid resin, isoprene resin, ethylene resin, epoxy resin, polyurethane resin, cellulose resin, perylene resin, imide resin, or mixtures of two or more of the above (CN201410009204). With the popularization of flexible display for use in harsh environments such as vehicle display, in order to guarantee the reliability of an organic light-emitting apparatus, the heat resistance of a thin film packaging organic layer generally has to be maintained above 100° C. (application Ser. No. 20/141,0009204), and the reliable service life of the organic layer under high temperature and humidity conditions (85% humidity and 85° C. temperature) has to be maintained above 400 hours. However, when the current thin film packaging organic layer is exposed at a high temperature for a long time, a phenomenon of stripping of the organic layer and the inorganic layer occurs.

Kateeva proposed, in TW201723104, an ink composition of dimethylacrylate and monomethacrylate. However, relevant data reported in the OLED device such as stability data of water and oxygen resistance is not seen.

Samsung SDI Co., Ltd. proposed, in TW201538596, a silicone-modified acrylic ink composition. Compared with an acrylic ink composition that does not contain silicone, the silicone-modified acrylic ink composition shows higher photocuring rate, high light transmittance, and low etching rate. However, it is difficult for the current ink composition to simultaneously meet performance index requirements such as high heat resistance and high reliability that are increasingly required for thin film packaging.

Everdisplay proposed, in CN111785845A, a thin film packaging layer introducing a POSS structure. Introducing an organic packaging layer is intended to improve heat stability and high light transmission, but a thin film packaging material of the packaging layer is obtained by means of preparation using a method for directly mixing a POSS structure-containing compound and a photoinitiator, and due to large molecular weight and large rigidity of a POSS structure-containing monomer, the viscosity of the monomer is large, such that film formation cannot be performed by using the current ink jet process mode. In addition, no detailed heat resistance or light transmittance data has been seen reported.

SUMMARY

In order to overcome the disadvantages in the related art that an organic thin film for OLED packaging has poor stability against water and oxygen, and is difficult to apply a current ink jet process to form a film, the present disclosure provides a POSS structure-containing ink composition and an application thereof, so as to overcome the above disadvantages.

An ink composition for OLED packaging includes, by weight percentage, 20-40% of a POSS structure-containing monomer;

50-70% of a photocuring monomer;

1-10% of a photoinitiator.

The POSS structure-containing monomer includes a repeating unit as shown in a general formula $(RSiO_{1.5})_n$.

Each R group is separately independently selected from vinyl, epoxy, allyl, carboxyl, a methacrylate group, amino, alkyl, alkylene, aryl or aryl with alkyl or alkylene, or an active group with alkyl or alkylene.

At least one R group is selected from a structure having acryloyloxy or methacryloyloxy.

The selection for manufacturing an OLED packaging thin film in the related art usually requires consideration of the following three problems: first, the packaging thin film needs to have good heat resistance and heat stability; second, the packaging thin film needs to have good barrier property against water vapor and oxygen; and third, on the basis of meet an actual packaging effect, the cost and process of the OLED packaging thin film during preparation are controlled. However, there are very few technical solutions that can address all three of these problems simultaneously.

The components in the ink composition in the present disclosure are selected mainly on the basis of considering how to overcome the above technical problems simultaneously.

First, in the present disclosure, a certain amount of (methyl) acryloyloxypropyl modified polyhedral oligomeric silsesquioxane(POSS) is added in the components, the general formula of the organic/inorganic hybrid structure POSS is $(RSiO_{1.5})_n$, wherein n=6, 8, 10 and 12, with structural formulas shown in the following formula (1):

(1)

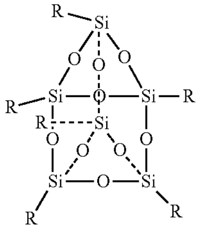

n = 6

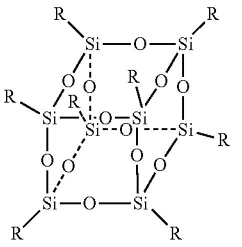

n = 8

-continued

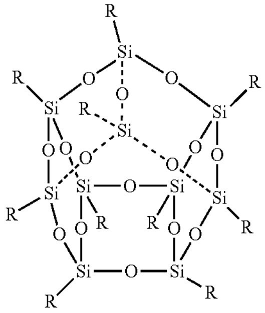

n = 10

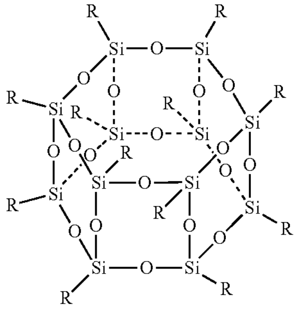

n = 12

The POSS is a compound having a nano-molecule-sized cage structure, and an inorganic core is a cage framework formed by a silicon-oxygen skeleton that is formed through alternate connection of Si—O—Si, such that chain motion of polymer molecules can be inhibited, so as to give a hybridized material good mechanical strength, optical performance, heat stability and low dielectric constants.

In addition, in order to guarantee the stability of a packaging material, the POSS used in the present disclosure is modified by (methyl) acryloyloxypropyl, such that the POSS has the capacity of forming a chemical cross-linking network through curing under UV light. Therefore, as a POSS structure is introduced into the entire system, due to a highly-symmetrical cage-like structure and a rich silicon-oxygen bond framework of the POSS structure, and a chemical cross-linking action between acryloyloxy and the photocuring monomer, the cured organic packaging layer is enabled to have excellent performance. On the one hand, the stability and heat resistance (Tg>100° C.) of a barrier layer after photocuring are significantly improved; on the other hand, the volume shrinkage ratio of the ink composition during curing is also significantly reduced, such that the problem of easy detachment between an organic barrier layer and an inorganic barrier layer is effectively solved. In addition, since the POSS structure limits the chain motion of polymer molecules, water vapor and oxygen hardly enter the organic packaging layer, such that the oxygen and the water vapor can be effectively isolated from permeating into an OLED device. Therefore, the service life of the OLED device can be effectively prolonged.

Although the POSS material has the above advantages, there is no precedent for the use of the material in flexible OLED devices. The reason is that, the use of the POSS material is limited by the following two material characteristics. First, although the POSS material has good mechanical strength, optical performance, heat stability and low dielectric constants due to large rigidity and huge steric effect, the POSS material is poor in flexibility and large in brittleness, such that the composition is likely to break under impact due to too much addition of the POSS material, resulting in no packaging effect; and second, when the POSS material is added too much, the viscosity of the entire ink is caused to be excessive, and unmatched surface tension is generated, affecting ink jet printing and spin-coating performance, thus resulting in difficult formation of the OLED packaging thin film.

Therefore, in the present disclosure, in an actual production process, it is found that when the content of a POSS structure monomer in the ink composition excesses 40%, the viscosity of the monomer is greatly increased, resulting in great reduction in ink jet printing and spin-coating performance; and the packaging thin film formed under the viscosity is poor in quality, not facilitating the packaging of the OLED device. After the content of the POSS structure monomer is less than 20%, although the ink jet printing and spin-coating performance of the monomer are good, the overall performance of the finally-formed packaging thin film is not significantly improved.

Therefore, in the present disclosure, by limiting the content of the POSS structure-containing monomer between 20% and 40%, the OLED packaging thin film not only good in ink jet printing and spin-coating performance, but also good in performance can be obtained.

Preferably, the structure of the POSS structure-containing monomer is shown in a general formula (2):

(2)

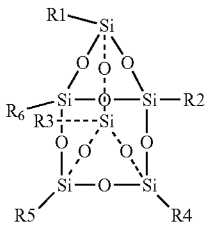

n = 6

At least one of R1-R6 groups is selected from a structure shown in a general formula (3):

(3)

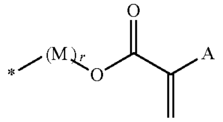

Wherein, "*" is a binding site of an element; A is selected from a hydrogen atom or methyl; M is selected from one of straight or branched alkyl having the number of carbon atoms less than or equal to 30, side hydroxyalkyl, ether alkyl, thioalkyl, and side (methyl) acryloyloxyalkyl; and r is selected from an integer from 0 to 4.

The preferred POSS structure monomer in the present disclosure is a monomer of which degree of polymerization is 6, which has the following advantages when compared to the POSS structure monomer with larger degree of polymerization, first, the monomer has a smaller volume, such that, after participating in curing, the OLED packaging thin film obtained through curing can have larger crosslinking density. Therefore, the OLED packaging thin film is more resistant to oxygen as well as water vapor. In addition, since the molecular mass of the POSS structure monomer of which degree of polymerization is 6 is smaller, the viscosity of the monomer is smaller at the same additive level, such that the monomer is more suitable for ink jet printing and spin-coating molding.

Further preferably, the POSS structure-containing monomer includes, but is not limited to, compounds shown in the following formulas (2-1) to (2-8).

2-1

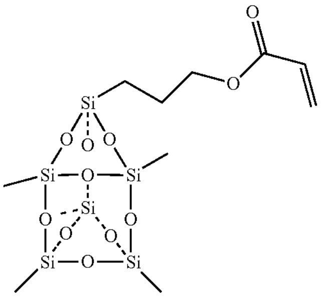

2-2

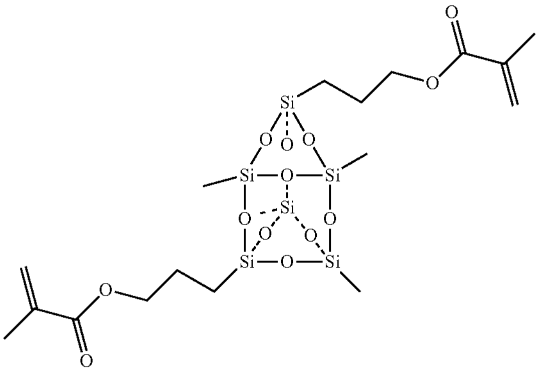

2-3

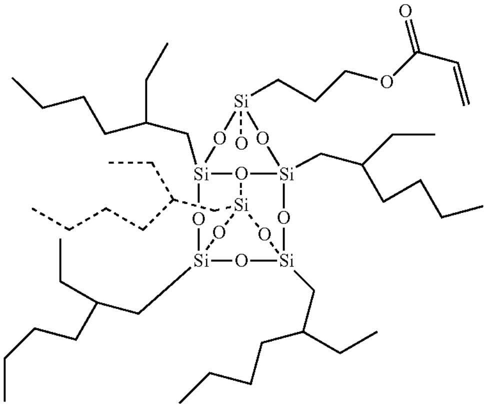

2-4

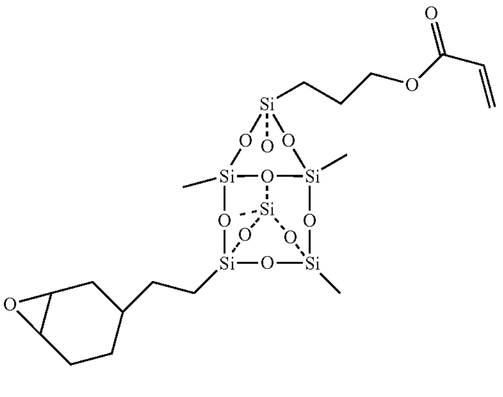

-continued 2-5

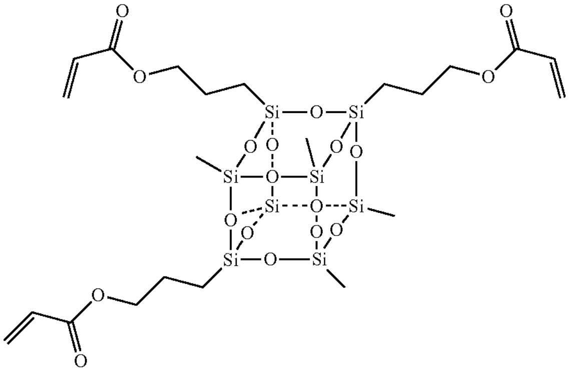

2-6

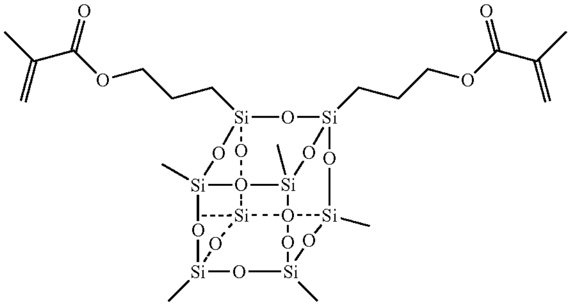

2-7

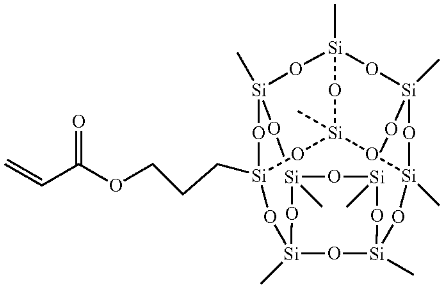

2-8

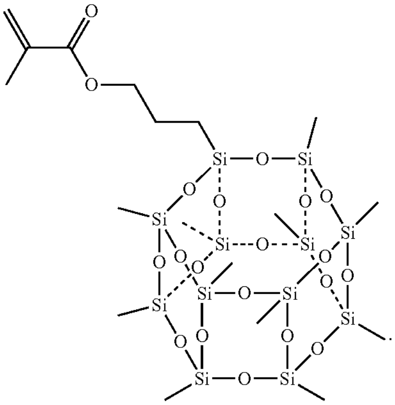

Preferably, the photocuring monomer is a composition of one or more of a monofunctional monomer, a bifunctional monomer, and a polyfunctional monomer, which has an acrylic structure or a methacrylic acid structure.

Further preferably, the photocuring monomer is a composition of one or more of monofunctional (meth)acrylate of monohydric alcohol or polyhydric alcohol from C1 to C30, bifunctional (meth)acrylate of monohydric alcohol or polyhydric alcohol from C2 to C30, and polyfunctional (meth) acrylate of monohydric alcohol or polyhydric alcohol from C3 to C30.

Further preferably, the monofunctional photocuring monomer may be classified, according to different structures, into alkyl acrylate, methacrylic hydroxy ester, (meth) acrylate with a ring structure or a benzene ring, and a vinyl monomer, and specifically includes: Lauryl Acrylate (LA), Ethoxyethoxyethyl Acrylate (EOEOEA)-KPX A007, Butyl Acrylate (BA), hydroxyethyl acrylate, isobornyl acrylate, Ethoxylated Tetrahydrofuran Acrylate (THF(EO)A)-KPX A015, methacrylate phosphate ester, and isobornyl methacrylate.

The bifunctional monomer is predominantly diol structures, which mainly include ethylene diacrylate, propylene glycol diacrylate, and other glycol diacrylate. Specifically structures include: Diethylene Glycol Diacrylate (DEGDA), Triethylene Glycol Diacrylate (TEGDA), ethylene diacrylate, Polyethylene Glycol (200) Diacrylate [PEG (200) DA], Polyethylene Glycol (400) Diacrylate [PEG (400) DA], Polyethylene Glycol (600) Diacrylate [PEG (600) DA], neopentyl glycol diacrylate, propoxylate neopentylene glycol diacrylate, 1,6-hexanedioldiacrylate (HDDA), 1,4-butanediol diacrylate (BDDA), ethoxylated (20) Bisphenol A Diacrylate [BPA(EO)20DA], and Tripropylene Glycol Diacrylate.

The polyfunctional monomer includes: Trimethylolpropane Triacrylate (TMPTA), Pentaerythritol Triacrylate (PETA), Trimethylolpropane Trimethacrylate (TMPTMA), trimethylolpropane propoxylate triacrylate, pentaerythritol triacrylate, propoxylated pentaerythritol acrylate, ditrimethylolpropane tetraacrylate, triethylene glycol dimethacrylate, long-chain aliphatic hydrocarbon glycidyl ether acrylate, dipentaerythritol hexaacrylate, tri(propylene glycol) diacrylate, Phthalic Diglycol Diacrylate (PDDA), Ethoxylated Trimethylolpropane Triacrylate [TMP(EO)TMA], Trimethylolpropane Propoxylate Triacrylate [TMP(PO)TMA], Propylene Glycerol Triacrylate [G(PO)TA], isocyanuric acid tris(2-acryloyloxyethyl) ester, Ethoxylated Neopentyl Glycol Methoxy Monoacrylate [TMP(PO)MEDA], etc.

Preferably, the photoinitiator may be a Type I or II photoinitiator. The Type I photoinitiator generates two radicals through radiation-induced cracking, one of which is reactive and initiates polymerization. The Type II photoinitiator becomes an excited triplet state through radiation-induced conversion. Molecules in the excited triplet state then react with ground state molecules, so as to produce the radicals initiating polymerization. The photoinitiator may include triazine, acetophenone, benzophenone, a phosphorus initiator, and a mixture thereof.

Examples of the triazine initiator include 2,4,6-trichloro-s-triazine, 2-phenyl-4,6-bis(trichloromethyl)-s-triazine, 2-(3',4'-dimethoxy styryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthalen-1-yl)-4,6-bis (trichloromethyl)-s-triazine, 2-(4-methoxynaphthalen-1-yl)-4,6-bis(trichlorometyl)-s-triazine, 2,4-trichloromethyl (piperonyl)-6-s-triazine, 2,4-(trichloromethyl-(4'-dimethoxy styryl)-6-triazine, and a mixture thereof.

Examples of the acetophenone initiator include 2,2'-diethoxyacetophenone, 2,2'-dibutoxyacetophenone, 2-hydroxy-2-methylpropiophenone, p-tert-butyl trichloroacetophenon, p-tert butyl dichloroacetophenone, 4-chloroacetophenone, 2,2'-dichloro-4-phenoxyacetophenone, 2-methyl-1-(4-methylthio)phenyl)-2-morpholinopropan-1-one, 2-benzyl-2-dimethylamino-1-(4-morpholinophenyl)-butan-1-one, and a mixture thereof.

Examples of the benzophenone initiator include benzophenone, benzoylbenzoic acid, benzoylbenzoic acid methyl, 4-phenylbenzophenone, hydroxy-benzophenone, acrylated benzophenone, 4,4'-bis(dimethylamino)benzophenone, 4,4-dichlorobenzophenone, 3,3'-dimethyl-2-methoxybenzophenone, and a mixture thereof.

Examples of the phosphorus initiator include dibenzoyl phenylphosphine oxide, benzoyl-diphenylphosphine oxide, and a mixture thereof.

For the selection of a specific photoinitiator for the given ink composition, the photoinitiator needs to be activated without damaging the wavelength of an OLED material. Therefore, various photoinitiators commonly used in the ink composition are compounds having peaks in the range of about 368 to about 420 nm mainly for absorption capacity. Generally, an absorption range of the photoinitiator selected for activation matches or overlaps with the output of a light source as closely as possible, such that the absorption of light may produce the radicals initiating polymerization, and the purpose of maximally using the light source may also be achieved. Commonly used light sources may select a mercury-arc lamp and an UV light-emitting diode.

In the above initiators, an acyl phosphine oxide photoinitiator such as diphenyl(2,4,6-trimethylbenzoyl)phosphine oxide (TPO) is a light yellow transparent solid, has good solubility with the monomer, and an absorption wavelength may reach 430 nm, such that the acyl phosphine oxide photoinitiator is suitable for photocuring of a colored system. An absorption wavelength of a photolysis product is able to be shifted to a short wave, so as to achieve a photobleaching effect, facilitating UV light transmission, such that the acyl phosphine oxide photoinitiator is suitable for curing of thick coatings. In addition, the acyl phosphine oxide photoinitiator is good in heat stability and storage, is light yellow itself and is colorless after photolysis, and does not turn yellow.

For various embodiments of the ink composition and printing method of the present application, an acyl phosphine photoinitiator such as TPO may use a compound with the absorption characteristic of 370-380 nm, and a light source that is emitted under a standard wavelength within a range from 350 nm to 430 nm is used to perform photocuring on the photocuring composition, so as to form an organic barrier layer. Therefore, the diphenyl(2,4,6-trimethylbenzoyl)phosphine oxide (TPO) and 2,4,6-trimethylbenzoyl diphenylphosphite are the most in line with requirements. On the one hand, the characteristic that the absorption wavelength may be prolonged to 430 nm may make the ink not damage the OLED material during UV curing; and on the other hand, the photoinitiators of the TPO series do not affect the light transmittance of an organic layer after being cured. Moreover, the heat resistance of the TPO may reach 180° C., such that, for the organic barrier layer, yellowing and membrane damage generated by small molecule by-products are avoided.

An organic packaging layer for OLED packaging is obtained by means of UV curing of the ink composition; a Water Vapor Transmission Rate (WVTR) is less than 4 $g/m^2$/day, light transmittance is greater than 95%, and a glass transition temperature is greater than 170° C.

The WVTR of an organic packaging layer for OLED packaging in the related art is generally high, such that the WVTR and an Oxygen Transmission Rate (OTR) of the organic packaging layer cannot achieve use requirements after the organic packaging layer is applied to a packaging process of an OLED device.

The WVTR of the organic packaging layer for OLED packaging in the present disclosure is less than 4 $g/m^2/day$, and, after the organic packaging layer is applied to the OLED device, the WVTR of the entire device can be less than $10^{-6}$ $g/m^2/day$, and the OTR is less than $10^{-5}$ $g/m^2/day$, such that the service life of the OLED device is prolonged.

Further preferably, a method for preparing the organic packaging layer includes: printing a photocurable ink composition with a thickness of 0.1 μm to 20 μm by means of spin-coating or ink jet printing, and then curing the ink composition by performing irradiation at about 10 to 500 $mW/cm^2$ for 1 second to about 300 seconds, so as to obtain the organic packaging layer.

As a packaging material, the method for preparing the organic packaging layer is also crucial. The photocuring ink component of the present application may be prepared by means of spin-coating or ink jet printing, and considering the control of cost and process, ink jet printing is preferred.

A flexible OLED device includes an OLED device and a flexible packaging layer, which is packaged on the outside of the OLED device. The flexible packaging layer is obtained by alternately overlaying an inorganic packaging layer and the organic packaging layer.

Preferably, the inorganic packaging layer may be prepared by depositing a layer of SiNx by means of PECVD, and a thickness ranges from 0.1 μm to 20 μm.

An OLED device apparatus includes a substrate Indium Tin Oxide (ITO), an OLED device (organic light-emitting diode) formed on the substrate and used for the apparatus, and a flexible packaging layer formed on a packaging component. Specifically, the flexible packaging layer is formed by overlaying an inorganic barrier layer SiNx, an organic barrier layer, and the inorganic barrier layer SiNx. The basic structure of the organic light-emitting diode is a sandwich-like structure that is formed by a thin and transparent ITO that has semiconductor properties and is connected to a positive electrode of electric power, and a metal cathode LiF. The entire structure layer includes a Hole Transport Layer (HTL), a light-emitting layer (EL), and an Electron Transport Layer (ETL); and the light-emitting layer includes RGB three primary colors, and toning layers for the three primary colors in combination.

The flexible packaging layer in the present disclosure can guarantee the smoothing property of the inorganic packaging layer during alternate deposition of the inorganic packaging layer and the organic packaging layer. In addition, the organic packaging layer can prevent the defects of the inorganic packaging layer from diffusing to other inorganic packaging layers.

Therefore, the present disclosure has the following beneficial effects.

(1) By means of introducing the POSS structure into the ink composition for OLED packaging, a better packaging effect is achieved.

(2) The organic packaging layer prepared by the ink has a good and extremely-low WVTR and OTR, such that the service life of the OLED device can be effectively prolonged.

(3) The ink composition in the present disclosure can effectively reduce the preparation cost and process difficulty of the OLED packaging thin film by means of a rational component proportion.

BRIEF DESCRIPTION OF THE DRAWINGS

The drawings, which form a part of the present application, are used to provide a further understanding of the present disclosure. The exemplary embodiments of the present disclosure and the description thereof are used to explain the present disclosure, but do not constitute improper limitations to the present disclosure. In the drawings.

DETAILED DESCRIPTION OF THE EMBODIMENTS

Figure 1:
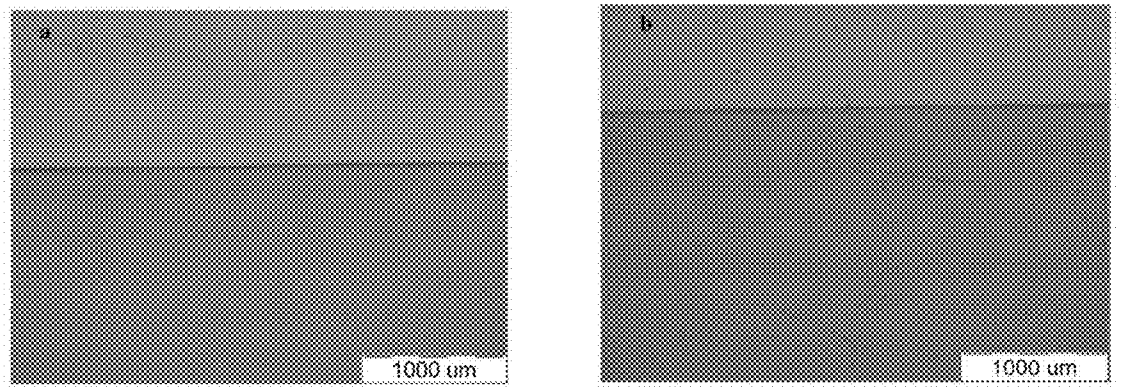
FIG. 1 shows a microscopic image before and after high-temperature aging according to Embodiment 1 of the present application, where a is an image before high-temperature aging, and b is an image after aging for 1 h at 100° C.

The present disclosure is further described below with reference to the specification drawings and specific embodiments. A person of ordinary skill in the art will be able to realize the present disclosure based on these descriptions. In addition, the embodiments mentioned in the following descriptions are only part of the embodiments of the present disclosure, not all the embodiments. Therefore, based on the embodiments in the present disclosure, all other embodiments obtained by those of ordinary skill in the art without creative work shall fall within the protection scope of the present disclosure.

Preparation of a POSS Structure-Containing Monomer 1-1

A synthetic process of a POSS structure-containing monomer 1-1 was shown in the following formula.

A silicotriol intermediate, which was prepared by hydrolyzing 3-(acryloyloxy)propyltrimethoxysilane under the catalysis of Tetramethylammonium Hydroxide (TMAH), and methylsilanetriol were condensed under a high-temperature condition of 85° C., so as to generate water and a final product 1-1.

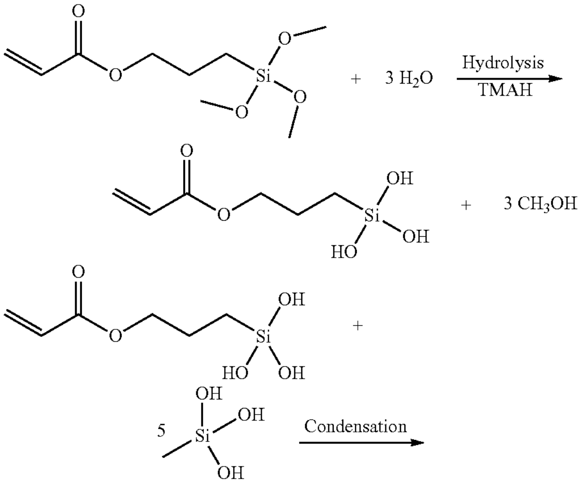

-continued

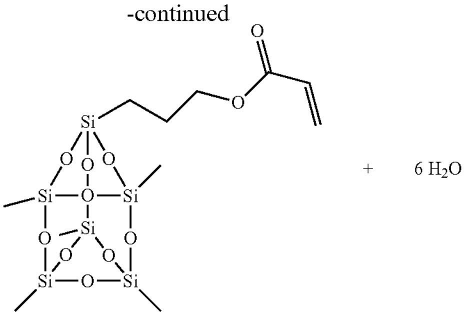

Experimental Procedure (1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 46.8 g of the 3-(acryloyloxy)propyltrimethoxysilane was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 94.1 g of the methylsilanetriol was added to the flask, then 120 mL of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-1, was obtained by means of filtration concentration and column chromatography separation (a mobile phase being ethyl acetate: petroleum ether=40:1-20:1). 95% purity was determined by HPLC; 1HNMR (400 MHz, Deuterated chloroform): δ6.43(d, 1H), δ6.05 (d, 1H),δ5.58(d, 1H),δ4.15(t,2H),δ1.6(m,2H),δ0.58(t, 2H),δ0.19(s,15H).

Preparation of a POSS Structure-Containing Monomer 1-2

A synthetic process of a POSS structure-containing monomer 1-2 was shown in the following formula.

A silicotriol intermediate, which was prepared by hydrolyzing 3-methacryloxypropyltrimethoxysilane (KH570) under the catalysis of TMAH, and methylsilanetriol were condensed under a high-temperature condition of 85° C., so as to generate water and a final product 1-2.

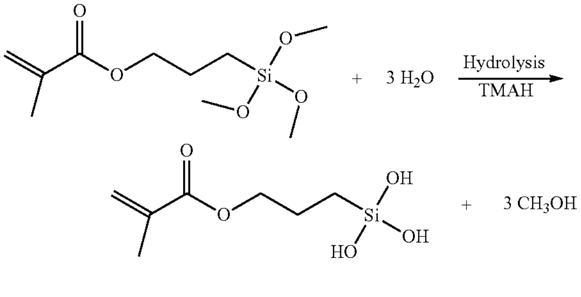

-continued

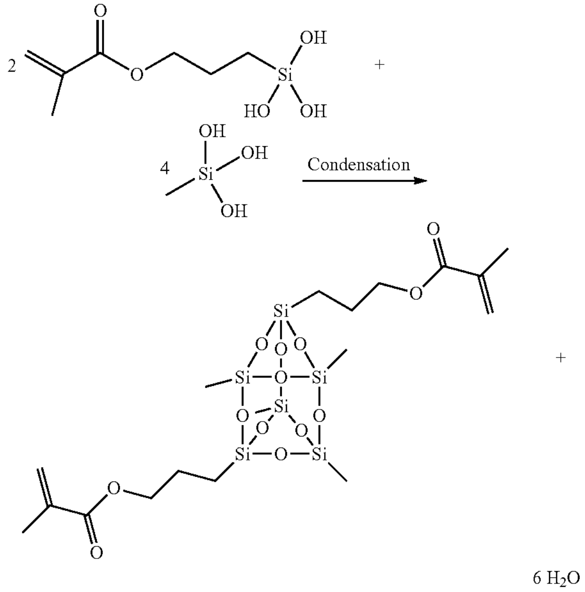

Experimental Procedure (1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 49.7 g of the 3-methacryloxypropyltrimethoxysilane (KH570) was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 37.7g of the methylsilanetriol was added to the flask, then 120 mL of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-2, was obtained by means of filtration concentration and column chromatography separation (a mobile phase being ethyl acetate: petroleum ether=40:1-20:1). 95% purity was determined by HPLC; $^1$HNMR(400 MHz, Deuterated chloroform): δ6.15(d,2H), δ5.58(d,2H),δ4.15(t,4H),δ1.93(t,6H),δ1.6(m,4H),δ0.58(t, 4H),δ0.19(s,12H).

Preparation of a POSS Structure-Containing Monomer 1-3

A synthetic process of a POSS structure-containing monomer 1-3 was shown in the following formula.

A silicotriol intermediate, which was prepared by hydrolyzing 3-(acryloyloxy)propyltrimethoxysilane under the catalysis of Tetramethylammonium Hydroxide (TMAH), and isooctylsilane triol were condensed under a high-temperature condition of 85° C., so as to generate water and a final product 1-3.

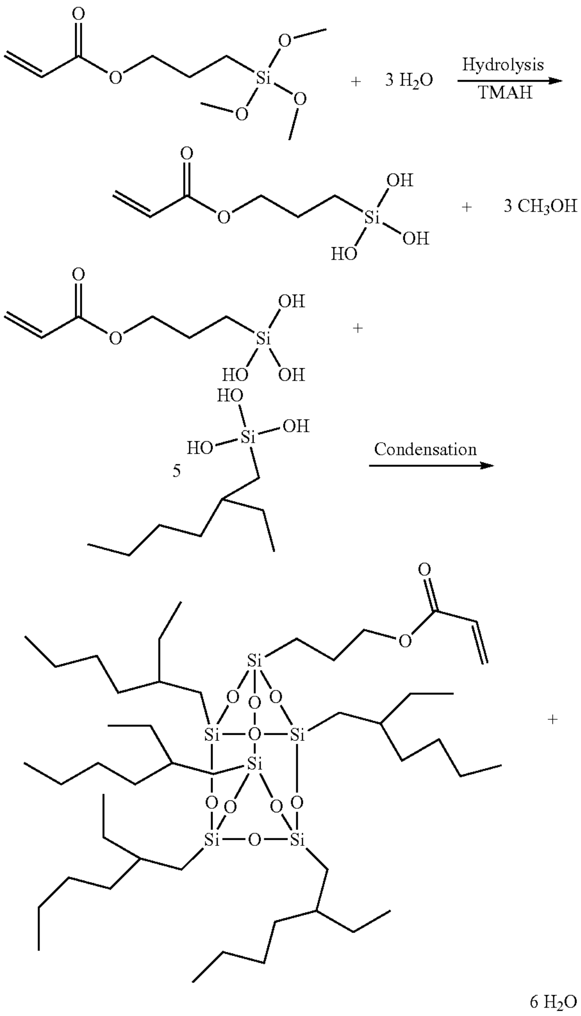

Experimental Procedure (1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 46.8 g of the 3-methacryloxypropyltrimethoxysilane (KH570) was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 192.3 g of the isooctylsilane triol was added to the flask, then 200 mL of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-3, was obtained by means of filtration concentration and column chromatography separation (a mobile phase being ethyl acetate: petroleum ether=40:1-20:1). 95% purity was determined by HPLC; $^{1}$HNMR(400 MHz, Deuterated chloroform):δ6.43(d,1H), δ6.05(d,1H),δ5.80(d,1H),δ4.15(t,2H),δ1.6(m,2H),δ1.5(m, 5H),δ1.33(m,10H),δ1.29(m,20H),δ1.25(m,10H),δ0.96(t, 30H),δ0.54(d,12H).

Preparation of a POSS Structure-Containing Monomer 1-4

A synthetic process of a POSS structure-containing monomer 1-4 was shown in the following formula.

A silicotriol intermediate, which was s prepared by hydrolyzing 3-(acryloyloxy)propyltrimethoxysilane under the catalysis of TMAH, was condensed with 2-(3,4-epoxycyclohexane)ethyltrimethoxysilane triol and methylsilanetriol under a high-temperature condition of 85° C., so as to generate water and a final product 1-4.

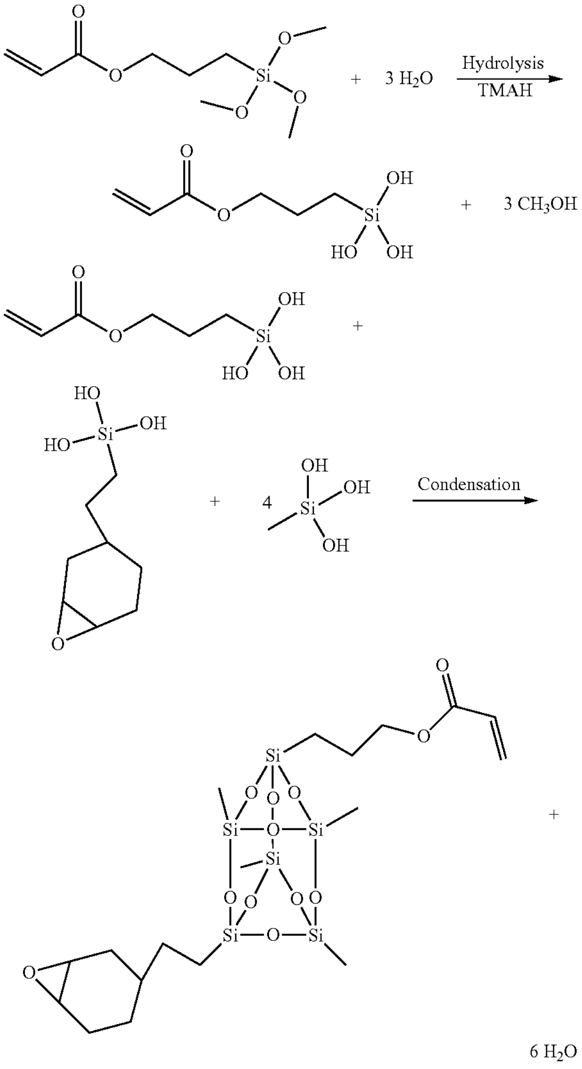

Experimental Procedure (1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 46.8 g of the 3-(acryloyloxy)propyltrimethoxysilane was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 75.3 g of the methylsilanetriol and 49.6 g of the 2-(3,4-epoxycyclohexane)ethyltrimethoxysilane triol were added to the flask, then 180 mL of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-4, was obtained by means of filtration concentration and column chromatography separation (a mobile phase being ethyl acetate:petroleum ether=40:1-20:1). 95% purity was determined by HPLC; $^1$HNMR(400 MHz, Deuterated chloroform):δ6.43(d, 1H),δ6.05(d,1H),δ5.80(d,1H),δ4.15(t,2H),δ2.87(m,2H), δ1.6(m,2H),δ1.57(m,2H),δ1.53(t,2H),δ1.43(t,1H),δ1.40(m, 2H),δ1.3(m,2H),δ0.58(t,4H),δ0.19(s,12H).

Preparation of a POSS Structure-Containing Monomer 1-5

A synthetic process of a POSS structure-containing monomer 1-5 was shown in the following formula.

A silicotriol intermediate, which was prepared by hydrolyzing 3-(acryloyloxy)propyltrimethoxysilane under the catalysis of Tetramethylammonium Hydroxide (TMAH), and methylsilanetriol were condensed under a high-temperature condition of 85° C., so as to generate water and a final product 1-5.

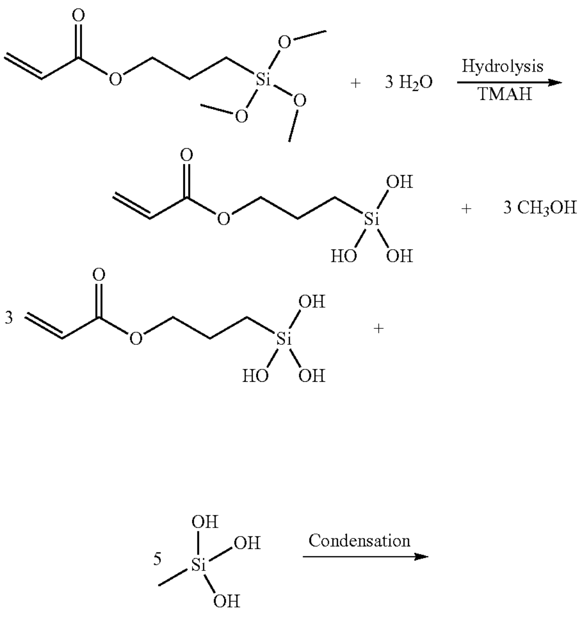

-continued

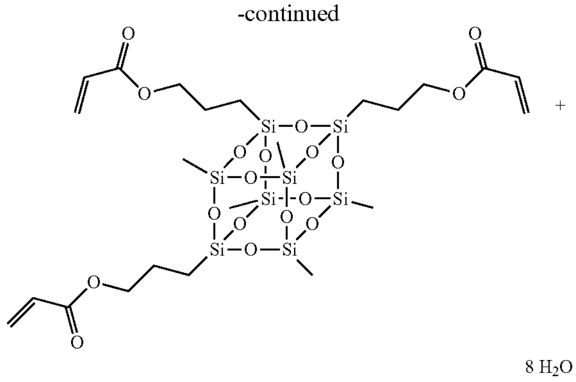

Experimental Procedure (1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 46.8 g of the 3-(acryloyloxy)propyltrimethoxysilane was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 31.4 g of the methylsilanetriol was added to the flask, then 60 mL of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-5, was obtained by means of filtration concentration and column chromatography separation (a mobile phase being ethyl acetate: petroleum ether=40:1-20:1). 95% purity was determined by HPLC; 1HNMR(400 MHZ, Deuterated chloroform):δ6.43(d,3H), δ6.05(d,3H),δ5.80(d,3H),δ4.15(t,6H),δ1.6(m,6H),δ0.58(t, 6H),δ0.19(s,15H).

Preparation of a POSS Structure-Containing Monomer 1-6

A synthetic process of a POSS structure-containing monomer 1-6 was shown in the following formula.

A silicotriol intermediate, which was prepared by hydrolyzing 3-methacryloxypropyltrimethoxysilane (KH570) under the catalysis of TMAH, and methylsilanetriol were condensed under a high-temperature condition of 85° C., so as to generate water and a final product 1-6.

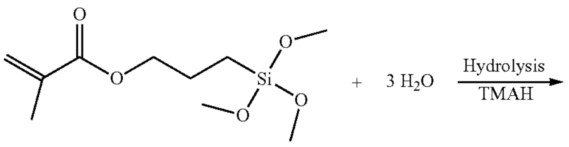

-continued

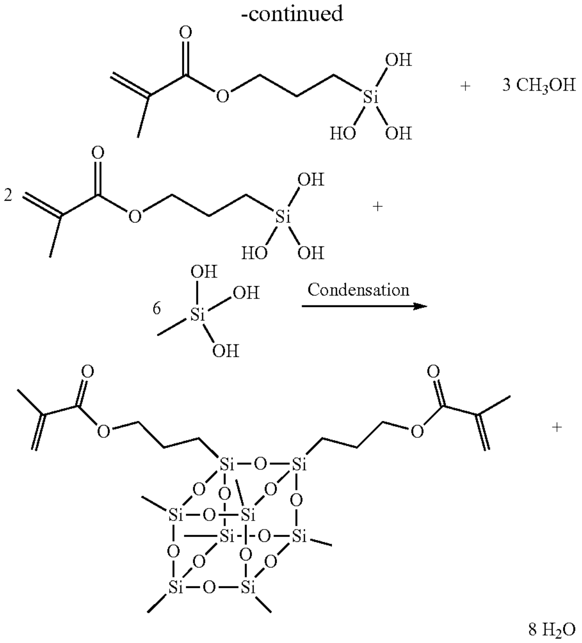

Experimental Procedure (1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 49.7 g of the 3-methacryloxypropyltrimethoxysilane (KH570) was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 56.5 g of the methylsilanetriol was added to the flask, then 120 mL of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-6, was obtained by means of filtration concentration and column chromatography separation (a mobile phase being ethyl acetate:petroleum ether=40:1-20:1). 95% purity was determined by HPLC; $^1$HNMR(400 MHz, Deuterated chloroform):δ6.15(d,2H), δ5.58(d,2H),δ4.15(t,4H),δ1.93(t,6H),δ1.6(m,4H),δ0.58(t, 4H),δ0.19(s,18H).

Preparation of a POSS Structure-Containing Monomer 1-7

A synthetic process of a POSS structure-containing monomer 1-7 was shown in the following formula.

A silicotriol intermediate, which was prepared by hydrolyzing 3-(acryloyloxy)propyltrimethoxysilane under the catalysis of Tetramethylammonium Hydroxide (TMAH), and methylsilanetriol were condensed under a high-temperature condition of 85° C., so as to generate water and a final product 1-7.

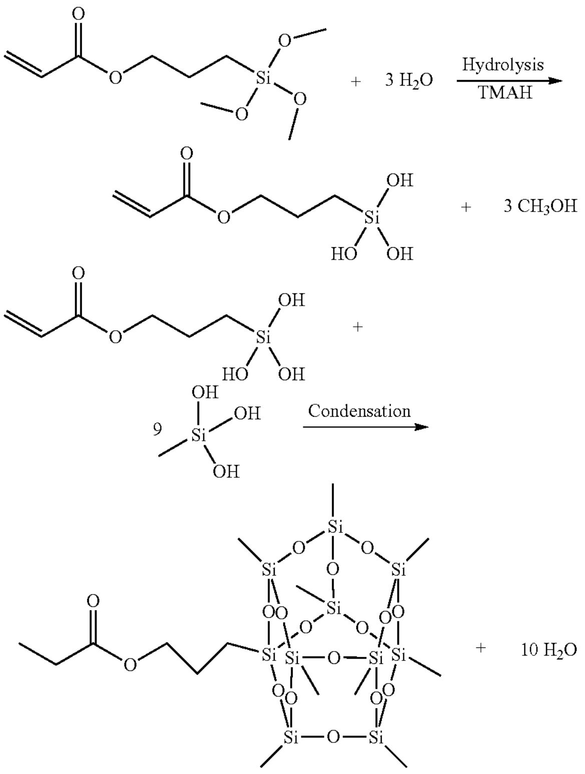

(1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 46.8 g of the 3-(acryloyloxy)propyltrimethoxysilane was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 169.5 g of the methylsilanetriol was added to the flask, then 200 ml of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-7, was obtained by means of filtration concentration and column chromatography separation (a mobile phase being ethyl acetate:petroleum ether=40:1-20:1). 95% purity was determined by HPLC; $^1$HNMR(400 MHz, Deuterated chloroform):δ6.43(d,1H), δ6.05(d,1H),δ5.80(d,1H),δ4.15(t,2H),δ1.6(m,2H),δ0.58(t, 2H),δ0.19(s,27H).

Preparation of a POSS Structure-Containing Monomer 1-8

A synthetic process of a POSS structure-containing monomer 1-8 was shown in the following formula.

A silicotriol intermediate, which was prepared by hydrolyzing 3-methacryloxypropyltrimethoxysilane (KH570)

under the catalysis of TMAH, and methylsilanetriol were condensed under a high-temperature condition of 85° C., so as to generate water and a final product 1-8.

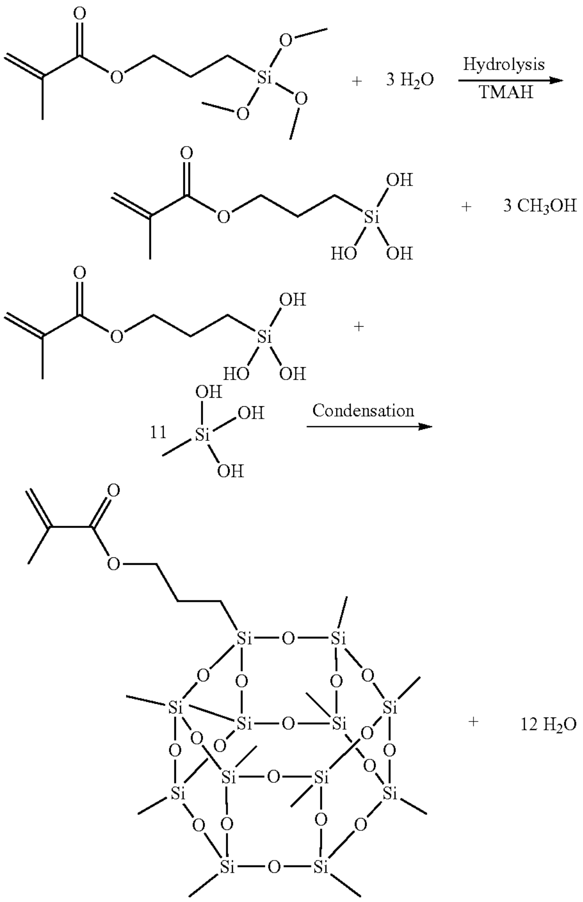

(1) 1.8 g of the TMAH (with the concentration being 25%), 10.8 g of distilled water, and 120 mL of an isopropanol solvent were added to a three-necked flask provided with a thermometer, a constant-pressure dripping funnel, and a condenser tube; the three-necked flask was placed into a constant-temperature (25° C.) magnetic stirring oil bath pot; 49.7 g of the 3-methacryloxypropyltrimethoxysilane (KH570) was taken and dissolved into 80 mL of the isopropanol, and the mixture was slowly dropwise added to the three-necked flask by means of the constant-pressure dripping funnel; and after full hydrolysis, the isopropanol was removed by using a rotary evaporator and by means of reduced pressure distillation.

(2) 207.1 g of the methylsilanetriol was added to the flask, then 240 ml of toluene was added, a reflux reaction was performed for 4 h by heating the temperature to 85° C.; extraction to neutral was performed with saturated salt water; colorless viscous liquid was obtained after removing the toluene through reduced pressure distillation; and a product with the yield being 75%, which is the POSS structure-containing monomer 1-8, was obtained by means of filtration concentration and column chromatography separation (a mobile phase being ethyl acetate:petroleum ether=40:1-20:1). 95% purity was determined by HPLC; $^{1}$HNMR(400 MHz, Deuterated chloroform):δ6.15(d,1H), δ5.58(d,1H),δ4.15(t,2H),δ1.93(t,3H),δ1.6(m,2H),δ0.58(t, 2H),δ0.19(s,33H).

Components used in the embodiments and the comparative examples were described in detail below.

(A) Photocuring monomer: (A1) Lauryl methacrylate (LA); (A2) Glycerol diacrylate (TPGDA); and (A3) propoxylated glycerol triacrylate ([G(PO)TA]).

(B) Silicon structure-containing monomer: (Ref.1) Reference compound; (B1) Monomer of 1-1; (B2) Monomer of 1-2; (B3) Monomer of 1-6; (B4) Monomer of 1-7; and (B5) Monomer of 1-8.

The structure of the Ref.1 compound was shown in a formula (4)

(4)

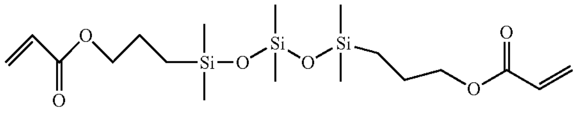

(C) Initiator: TPO(BASF).

Embodiments and Comparative Examples

The (A) photocuring monomer, the (B) POSS structure-containing monomer, the reference compound Ref.1, and the (C) initiator were placed into a 250 mL brown polypropylene bottle according to amount (in weight percentage) listed in Table 2, and then mixing was performed for 0.5 hours by using ultrasonic, so as to prepare a composition.

Results for evaluating the performance of the compositions in the embodiments and the comparative examples were shown in Table 2 below.

TABLE 2

Performance results for compositions in embodiments and comparative examples

| | A | | | B | | | | | | |
|---|---|---|---|---|---|---|---|---|---|---|
| Item | A1 | A2 | A3 | B1 | B2 | B3 | B4 | B5 | Ref. 1 | C |
| Embodiment 1 | 30 | 25 | — | 40 | — | — | — | — | — | 5 |
| Embodiment 2 | 30 | 30 | — | 35 | — | — | — | — | — | 5 |
| Embodiment 3 | 30 | 35 | — | 30 | | — | — | — | — | 5 |
| Embodiment 4 | 35 | 35 | — | 25 | | — | — | — | — | 5 |
| Embodiment 5 | 30 | 40 | — | 20 | | — | — | — | — | 10 |
| Embodiment 6 | 30 | 25 | — | — | 40 | — | — | — | — | 5 |
| Embodiment 7 | 30 | 30 | — | — | 35 | — | — | — | — | 5 |
| Embodiment 8 | 30 | 35 | — | — | 30 | — | — | — | — | 5 |
| Embodiment 9 | 35 | 35 | — | — | 25 | — | — | — | — | 5 |
| Embodiment 10 | 30 | 40 | — | — | 20 | — | — | — | — | 10 |
| Embodiment 11 | 30 | 30 | — | — | — | 35 | — | — | — | 5 |

TABLE 2-continued

Performance results for compositions in embodiments and comparative examples

| Item | A | | | B | | | | | | |
|---|---|---|---|---|---|---|---|---|---|---|
| | A1 | A2 | A3 | B1 | B2 | B3 | B4 | B5 | Ref. 1 | C |
| Embodiment 12 | 30 | 30 | — | — | — | — | 35 | — | — | 5 |
| Embodiment 13 | 30 | 30 | — | — | — | — | — | 35 | — | 5 |
| Embodiment 14 | 30 | 20 | 10 | 35 | — | — | — | — | — | 5 |
| Embodiment 15 | 30 | 20 | 9 | 40 | — | — | — | — | — | 1 |
| Comparative example 1 | 45 | 30 | 20 | — | — | — | — | — | — | 5 |
| Comparative example 2 | 30 | 45 | 20 | — | — | — | — | — | — | 5 |
| Comparative example 3 | 30 | 20 | 45 | — | — | — | — | — | — | 5 |
| Comparative example 4 | 30 | 30 | — | — | — | — | — | — | 35 | 5 |
| Comparative example 5 | 30 | 30 | — | 5 | — | — | — | — | 30 | 5 |
| Comparative example 6 | 40 | 50 | — | 5 | — | — | — | — | — | 5 |
| Comparative example 7 | 40 | 45 | — | 10 | — | — | — | — | — | 5 |
| Comparative example 8 | 40 | 40 | — | 15 | — | — | — | — | — | 5 |
| Comparative example 9 | 40 | 10 | — | 45 | — | — | — | — | — | 5 |
| Comparative example 10 | 35 | 10 | — | 50 | — | — | — | — | — | 5 |

Application Example 1

An organic packaging layer was obtained by printing the photocuring ink composition in Embodiments 1-14 with a thickness of 0.1 μm to 20 μm by means of spin-coating or ink jet printing, and then curing the ink composition by performing irradiation at about 10 to 500 mW/cm$^2$ for 1 second to about 300 seconds.

Application Example 2

Figure 3:
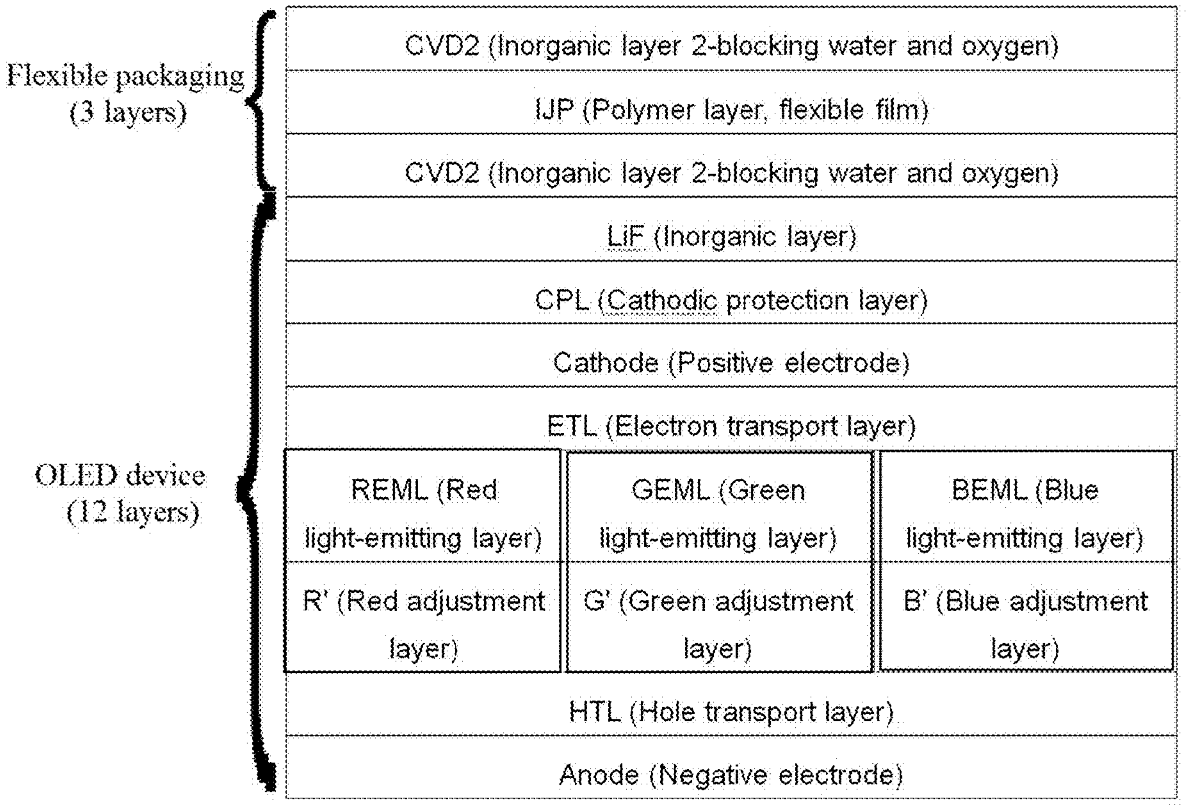
FIG. 3 shows a schematic structural diagram of a flexible OLED device according to the present application.

As shown in FIG. 3, a flexible OLED device included an OLED device and a flexible packaging layer, which was packaged on the outside of the OLED device. The flexible packaging layer was obtained by alternately overlaying an inorganic packaging layer, the organic packaging layer, and the inorganic packaging layer.

The inorganic packaging layer might be prepared by depositing a layer of SiNx by means of PECVD, and a thickness ranges from 0.1 μm to 20 μm.

An OLED device apparatus included a substrate ITO, an OLED device (organic light-emitting diode) formed on the substrate and used for the apparatus, and a flexible packaging layer formed on a packaging component. Specifically, the flexible packaging layer was formed by overlaying the inorganic packaging layer SiNx, the organic packaging layer, and the inorganic barrier layer SiNx. The basic structure of the organic light-emitting diode was a sandwich-like structure that is formed by a thin and transparent ITO that had semiconductor properties and was connected to a positive electrode of electric power, and a metal cathode LiF. The entire structure layer included a hole transport layer (HTL), a light-emitting layer (EL), and an electron transport layer (ETL); and the light-emitting layer included RGB three primary colors, and toning layers for the three primary colors in cooperation.

As a polymer thin film formed by the photocuring packaging composition of the present application had higher heat resistance, higher light transmittance, lower curing volume shrinkage ratio, and lower plasma etching rate as the organic barrier layer, an optical requirement and a curing requirement for a packaging structure could be well met. The flexible packaging layer in the present disclosure could guarantee the smoothing property of the inorganic packaging layer by alternately depositing the inorganic packaging layer and the organic packaging layer. In addition, when the flexible packaging layer formed an inorganic-organic-inorganic thin film packaging structure through alternate deposition with the inorganic barrier layer, plasma etching during formation of an inorganic layer could be withstood, and the defects of the inorganic barrier layer were prevented from diffusing to other inorganic barrier layers, such that a good packaging effect was maintained.

Performance Evaluation

WVTR: applying a Water vapour transmission rate testing system (PERMATRAN-W3/33, manufactured by MOCON in the United States). The photocuring composition was sprayed or ink-jet printed on a glass substrate, and was cured for 180 seconds through UV curing under UV irradiation at 200 mW/cm$^2$, so as to manufacture a curing sample with the thickness being 5 μm. A WVTR tester (PERMATRAN-W3/33, manufactured by MOCON in the United States) was used to test the WVTR for 24 hours at 40° C. and relative humidity of 100% according to the layer thickness of 5 μm.

Light transmittance test: applying an ultraviolet visible spectrophotometer testing system (Carry 5000, manufactured by Agilent Technologies, Inc. in the United States). The photocuring composition was sprayed or ink-jet printed on a glass substrate, and was cured for 180 seconds through UV curing under UV irradiation at 200 mW/cm$^2$, so as to manufacture a curing sample with the thickness being 10 μm. The ultraviolet visible spectrophotometer testing system (Carry 5000, manufactured by Agilent Technologies, Inc. in the United States) was used to measure the light transmittance of a film at a visible light range of 550 nm.

Photocuring rate: FT-IR (Nicolet iS10, Thermo) was used to test absorption peak intensity of the photocuring composition near 1635 $cm^{-1}$(C=C) and 1720 $cm^{-1}$(C=O). First, the photocuring composition was sprayed or ink-jet printed on the glass substrate, and was cured for 180 seconds through UV curing under UV irradiation at 200 $mW/cm^2$, so as to manufacture a sample with the size being 20 cm×20 cm×3 μm (width×length×thickness). The cured film was cut into samples, and then the FT-IR(Nicolet iS10, Thermo) was used to test the absorption peak intensity of the samples at 1635 $cm^{-1}$(C=C) and 1720 $cm^{-1}$(C=O).

The photocuring rate was calculated by an equation 1.

$$\text{Photocuring rate}(\%) = |1-(A/B)|\times 100. \quad \text{(Equation 1)}$$

Wherein A was a ratio of the absorption peak intensity of the cured film near 1635 $cm^{-1}$ to the absorption peak intensity near 1720 $cm^{-1}$; and B was a ratio of the absorption peak intensity of the photocuring composition near 1635 $cm^{-1}$ to the absorption peak intensity near 1720 $cm^{-1}$.

Heat resistance test: a simple blast constant-temperature oven is used to perform heating to a constant temperature and time, and then the heat resistance of the film was evaluated according to the physical performance of the film or surface changes (referring to GB/T, 1735-89<Method for Determining Heat Resistance of a Paint Film>). The photocuring composition was sprayed or ink-jet printed on a glass substrate, and was cured for 180 seconds through UV curing under UV irradiation at 200 $mW/cm^2$, so as to manufacture 2 curing samples with the thicknesses being 10 μm. One of the samples was heated to 100° C. for 1 h by using the blast constant-temperature oven, then cooled to 25° C., and compared with a standard left in advance, so as to check for discoloration, shedding, wrinkling, etc.

Performance parameters in the embodiments and the comparative examples were shown in Table 3 below.

TABLE 3

Performance parameter table

| Item | WVTR ($g/m^2$/day) | Light transmittance (%) | Photocuring rate (%) | Viscosity (mPas) | Glass transition temperature (° C.) | Heat resistance |
|---|---|---|---|---|---|---|
| Embodiment 1 | 2.6 | 96.2 | 96.4 | 21.2 | 185 | Good |
| Embodiment 2 | 2.9 | 95.9 | 96.0 | 20.6 | 181 | Good |
| Embodiment 3 | 3.0 | 95.8 | 95.7 | 20.2 | 178 | Good |
| Embodiment 4 | 3.2 | 95.7 | 95.4 | 19.9 | 177 | Good |
| Embodiment 5 | 3.3 | 95.4 | 95.4 | 19.7 | 176 | Good |
| Embodiment 6 | 2.8 | 96.3 | 96.3 | 21.5 | 186 | Good |
| Embodiment 7 | 3.1 | 96.0 | 96.1 | 20.8 | 179 | Good |
| Embodiment 8 | 3.3 | 95.8 | 95.8 | 20.4 | 177 | Good |
| Embodiment 9 | 3.3 | 95.5 | 95.5 | 19.8 | 176 | Good |
| Embodiment 10 | 3.5 | 95.5 | 95.3 | 19.7 | 172 | Good |
| Embodiment 11 | 3.4 | 95.6 | 95.6 | 20.4 | 170 | Good |
| Embodiment 12 | 3.7 | 94.9 | 95.2 | 20.0 | 173 | Good |
| Embodiment 13 | 3.6 | 95.2 | 94.7 | 20.3 | 171 | Good |
| Embodiment 14 | 3.0 | 95.6 | 95.8 | 20.4 | 179 | Good |
| Embodiment 15 | 3.1 | 95.5 | 95.7 | 20.9 | 173 | Good |
| Comparative example 1 | 6.7 | 94.1 | 93.8 | 18.9 | 145 | Wrinkling and shedding |
| Comparative example 2 | 7.5 | 93.6 | 93.4 | 18.5 | 147 | Wrinkling and shedding |
| Comparative example 3 | 7.8 | 93.3 | 93.5 | 18.4 | 143 | Wrinkling and shedding |
| Comparative example 4 | 4.8 | 94.5 | 94.9 | 19.5 | 159 | Wrinkling and shedding |
| Comparative example 5 | 4.2 | 94.9 | 95.2 | 20.3 | 164 | Wrinkling and shedding |
| Comparative example 6 | 5.6 | 94.7 | 94.6 | 19.6 | 161 | Wrinkling and shedding |

TABLE 3-continued

| Performance parameter table | | | | | | |
|---|---|---|---|---|---|---|
| Item | WVTR ($g/m^2$/day) | Light trans-mittance (%) | Photo-curing rate (%) | Viscosity (mPas) | Glass transition temperature (° C.) | Heat resistance |
| Comparative example 7 | 5.1 | 95.0 | 95.0 | 19.9 | 164 | Wrinkling and shedding |
| Comparative example 8 | 3.9 | 95.2 | 95.2 | 18.6 | 169 | Wrinkling and shedding |
| Comparative example 9 | 2.7 | 96.3 | 96.7 | 24.5 | 188 | Not suitable for ink jet printing |
| Comparative example 10 | 2.5 | 96.4 | 96.9 | 26.2 | 191 | Not suitable for ink jet printing |

Figure 2:
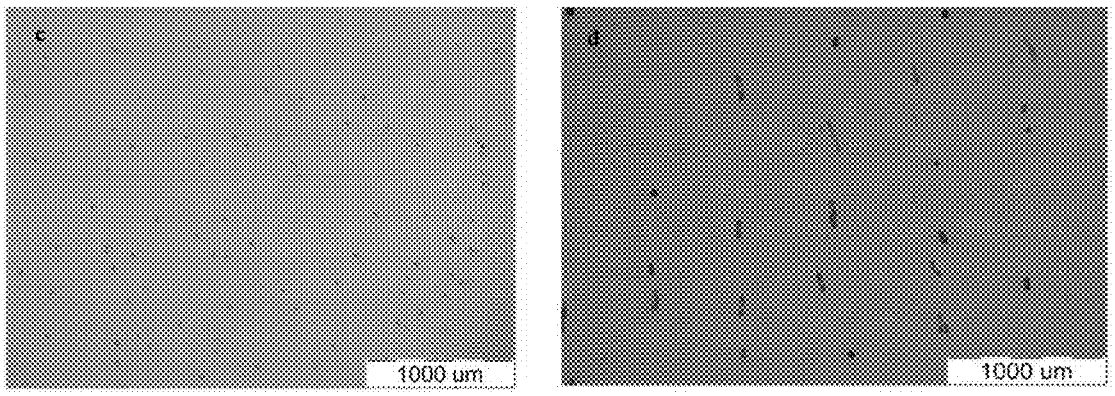
FIG. 2 shows a microscopic image before and after high-temperature aging according to Comparative example 4 of the present application, where c is an image before high-temperature aging, and d is an image after aging for 1 h at 100° C.

By means of comparing Embodiments 1-14 with Comparative examples 1-5, in the present disclosure, low WVTR, higher light transmittance, and similar curing rate were shown after adding the POSS structure-containing monomer to the composition. In addition, compared with the comparative examples, the photocuring composition of the present disclosure showed quite high heat resistance; and compared with a photocuring composition of a monomer without containing the POSS structure, a thin film prepared by the photocuring composition of the POSS structure-containing monomer did not show wrinkling and shedding in an optical microscope image after high-temperature aging, as shown in FIGS. 1 and 2. Therefore, the photocuring composition having the POSS structure-containing monomer of the present disclosure could show, when being used as the organic packaging layer of an OLED device, an excellent water-oxygen barrier effect, and had good heat resistance and stability, such that the performance of the device was well protected, the service life of the device was improved, and the photocuring composition had more excellent packaging effect on the OLED device.

By comparing Embodiments 1-5 with Comparative examples 6-10, we found that, as the addition of the POSS structure-containing monomer increases in the composition, the WVTR, the light transmittance and the heat resistance were improved accordingly, and this might be learned from Embodiments 6-10. Therefore, it may be seen that, within the range of certain addition, the comprehensive performance of the composition could be improved by increasing the addition of the POSS structure-containing monomer. Addition of 20% was a watershed in overall performance parameters. When the addition of a POSS structure-containing epoxy monomer was less than 20% (Comparative examples 6-8), the overall WVTR and heat resistance were relatively poor, and the composition was easy to wrinkle and shed at a high temperature, which could not achieve an actual use requirement. After the addition was greater than or equal to 20%, the curing volume shrinkage ratio, WVTR and heat resistance of the composition were all significantly improved, such that it indicated that the performance of a packaging thin film was better due to the increased content of the POSS structure-containing epoxy monomer.

However, the addition of the POSS structure-containing monomer was not always the higher the better. With the increasing of the addition of the POSS structure-containing monomer, the viscosity of the entire composition was greatly enhanced, such that the addition of the POSS structure-containing monomer being 40% was another watershed in overall performance parameters. When the addition of the POSS structure-containing monomer was between 20% and 40%, the viscosity of the composition was smaller, such that the composition could better adapt the ink jet printing step. After the addition of the POSS structure-containing monomer was increased to 45% and 50%, the system viscosity of the composition was dramatically increased to 24.5 mPa·s and 26.2 mPa·s, such that the composition could not achieve the final ink jet printing step.

Therefore, in conclusion, it indicated that the addition of the POSS structure-containing monomer had significant influence on the performance of the entire composition. To sum up, within the addition range of 20%-40%, the ink composition for OLED packaging with excellent performance and good printing effect could be obtained.

By comparing Embodiment 2, Embodiment 7, Embodiment 11, Embodiment 12, and Embodiment 13, we found that, when the addition of the POSS structure-containing monomer was the same, the structure of the POSS structure-containing monomer had certain influence on the performance of the ink composition. The degrees of polymerization of the POSS structure-containing monomers in Embodiment 2, Embodiment 7, Embodiment 11, Embodiment 12, and Embodiment 13 respectively were 6, 6, 8, 10, 12. We found that with the increasing of the degree of polymerization of the POSS structure-containing monomer, the performance parameters such as the WVTR was reduced to a certain extent. It indicated that, compared with the POSS structure monomer with a larger degree of polymerization, the monomer with a smaller degree of polymerization had a smaller size, such that, after participating in curing, the OLED packaging thin film obtained through curing could have larger crosslinking density. Therefore, the OLED packaging thin film was more resistant to oxygen as well as water vapor.

Therefore, the thin film, which is prepared through UV curing of the ink composition for packaging of the POSS structure-containing monomer in the present disclosure, had an excellent packaging effect, and could well meet a thin film packaging requirement of the current OLED device.

Those skilled in the art should understand that the present disclosure is not limited to the above embodiments, and that various modifications and changes may be made without departing from the spirit and scope of the present disclosure, and that any modifications, substitutions, improvements, etc. made shall be within the scope of protection of the present disclosure. Accordingly, these embodiments are provided for illustrative purposes only and are not to be construed as limiting the present disclosure in any way.

What is claimed is:

1. An ink composition for Organic Light-Emitting Diode (OLED) packaging, comprising, by weight percentage, 20-40% of a Polyhedral Oligomeric Silsesquioxane (POSS) structure-containing monomer;

50-70% of a photocuring monomer; and 1-10% of a photoinitiator, the POSS structure-containing monomer comprises a repeating unit as shown in a general formula $(R—SiO_{1.5})_n$;

wherein, each R group is separately independently selected from vinyl, epoxy, allyl, carboxyl, a methacrylate group, amino, alkyl, alkylene, aryl or aryl with alkyl or alkylene, or an active group with alkyl or alkylene;

and at least one R group is selected from a structure having acryloyloxy or methacryloyloxy.

2. The ink composition for OLED packaging according to claim 1, wherein the structure of the POSS structure-containing monomer is shown in a general formula (2):

(2)

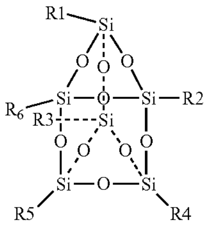

n = 6 at least one of R1-R6 groups is selected from a structure shown in a general formula (3):

(3)

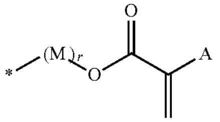

wherein, "*" is a binding site of an element; A is selected from a hydrogen atom or methyl; M is selected from one of straight or branched alkyl, side hydroxyalkyl, ether alkyl, thioalkyl, and side (methyl) acryloyloxyalkyl having the number of carbon atoms less than or equal to 30; and r is selected from an integer from 0 to 4.

3. The ink composition for OLED packaging according to claim 1, wherein the photocuring monomer is a composition of one or more of a monofunctional monomer, a bifunctional monomer, and a polyfunctional monomer, which have an acrylic structure or a methacrylic acid structure.

4. The ink composition for OLED packaging according to claim 3, wherein the photocuring monomer is a composition of one or more of monofunctional (meth) acrylate of monohydric alcohol or polyhydric alcohol from C1 to C30, bifunctional (meth) acrylate of monohydric alcohol or polyhydric alcohol from C2 to C30, and polyfunctional (meth) acrylate of monohydric alcohol or polyhydric alcohol from C3 to C30.

5. The ink composition for OLED packaging according to claim 1, wherein the photoinitiator is a composition of one or more of a triazine initiator, an acetophenone initiator, a benzophenone initiator, and a phosphorus initiator.

6. An organic packaging layer for Organic Light-Emitting Diode (OLED) packaging, obtained by means of Ultraviolet (UV) curing of the ink composition according to of claim 1, wherein a Water Vapor Transmission Rate (WVTR) is less than 4 $g/m^2/day$, light transmittance is greater than 95%, and a glass transition temperature is greater than 170° C.

7. The organic packaging layer for OLED packaging according to claim 6, wherein the thickness of the organic packaging layer is 0.1-20 μm.

8. A flexible Organic Light-Emitting Diode (OLED) device, comprising an OLED device and a flexible packaging layer, which is packaged on the outside of the OLED device, wherein the flexible packaging layer is obtained by alternately overlaying an inorganic packaging layer and the organic packaging layer according to claim 6 or 7.

9. The flexible OLED device according to claim 8, wherein an inorganic barrier layer is made of SiNx, and has the thickness being 0.1-20 μm.

10. An organic packaging layer for Organic Light-Emitting Diode (OLED) packaging, obtained by means of Ultraviolet (UV) curing of the ink composition according to claim 2, wherein a Water Vapor Transmission Rate (WVTR) is less than 4 $g/m^2/day$, light transmittance is greater than 95%, and a glass transition temperature is greater than 170° C.

11. An organic packaging layer for Organic Light-Emitting Diode (OLED) packaging, obtained by means of Ultraviolet (UV) curing of the ink composition according to claim 3, wherein a Water Vapor Transmission Rate (WVTR) is less than 4 $g/m^2/day$, light transmittance is greater than 95%, and a glass transition temperature is greater than 170° C.

12. An organic packaging layer for Organic Light-Emitting Diode (OLED) packaging, obtained by means of Ultraviolet (UV) curing of the ink composition according to claim 4, wherein a Water Vapor Transmission Rate (WVTR) is less than 4 $g/m^2/day$, light transmittance is greater than 95%, and a glass transition temperature is greater than 170° C.

13. An organic packaging layer for Organic Light-Emitting Diode (OLED) packaging, obtained by means of Ultraviolet (UV) curing of the ink composition according to claim 5, wherein a Water Vapor Transmission Rate (WVTR) is less than 4 $g/m^2/day$, light transmittance is greater than 95%, and a glass transition temperature is greater than 170° C.

14. A flexible Organic Light-Emitting Diode (OLED) device, comprising an OLED device and a flexible packaging layer, which is packaged on the outside of the OLED device, wherein the flexible packaging layer is obtained by alternately overlaying an inorganic packaging layer and the organic packaging layer according to claim 7.

15. The flexible OLED device according to claim 14, wherein an inorganic barrier layer is made of SiNx, and has the thickness being 0.1-20 μm.

16. A flexible Organic Light-Emitting Diode (OLED) device, comprising an OLED device and a flexible packaging layer, which is packaged on the outside of the OLED device, wherein the flexible packaging layer is obtained by alternately overlaying an inorganic packaging layer and the organic packaging layer according to claim 10.

17. A flexible Organic Light-Emitting Diode (OLED) device, comprising an OLED device and a flexible packaging layer, which is packaged on the outside of the OLED device, wherein the flexible packaging layer is obtained by alternately overlaying an inorganic packaging layer and the organic packaging layer according to claim 11.

18. A flexible Organic Light-Emitting Diode (OLED) device, comprising an OLED device and a flexible packaging layer, which is packaged on the outside of the OLED device, wherein the flexible packaging layer is obtained by alternately overlaying an inorganic packaging layer and the organic packaging layer according to claim 12.

19. A flexible Organic Light-Emitting Diode (OLED) device, comprising an OLED device and a flexible packaging layer, which is packaged on the outside of the OLED device, wherein the flexible packaging layer is obtained by alternately overlaying an inorganic packaging layer and the organic packaging layer according to claim 13.

* * * * *